United States Patent
Maarouf

(10) Patent No.: US 8,446,168 B2
(45) Date of Patent: May 21, 2013

(54) PRE-EMPHASIS TECHNIQUE FOR ON-CHIP VOLTAGE-DRIVEN SINGLE-ENDED-TERMINATION DRIVERS

(75) Inventor: Fares K. Maarouf, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/968,190

(22) Filed: Dec. 14, 2010

(65) Prior Publication Data

US 2012/0146686 A1    Jun. 14, 2012

(51) Int. Cl.
*H03K 17/16* (2006.01)
*H03K 19/003* (2006.01)

(52) U.S. Cl.
USPC ............ 326/30; 326/27; 326/83; 326/87

(58) Field of Classification Search
USPC ............ 326/21–34, 82–87; 327/108–112
See application file for complete search history.

(56) References Cited

U.S. PATENT DOCUMENTS

| | | | |
|---|---|---|---|
| 6,281,715 B1 * | 8/2001 | DeClue et al. | 327/65 |
| 2009/0003463 A1 | 1/2009 | Muraoka et al. | |
| 2009/0045852 A1 * | 2/2009 | Agarwal | 327/108 |

OTHER PUBLICATIONS

International Search Report and Written Opinion—PCT/US2011/064980—ISA/EPO—Mar. 23, 2012.

* cited by examiner

*Primary Examiner* — Jany Richardson
(74) *Attorney, Agent, or Firm* — William M. Hooks

(57) ABSTRACT

A transmitter configured for pre-emphasis is described. The transmitter includes a voltage-driven single-ended-termination driver circuitry. The voltage-driven single-ended-termination driver circuitry includes a first termination point and a second termination point. The transmitter also includes a pre-emphasis encoder circuitry. The pre-emphasis encoder circuitry receives a pre-emphasis signal. The transmitter may reduce signal loss in transmission lines by detecting a transition in a data stream, adjusting a source determination resistance and obtaining a gain from the adjusted source determination resistance.

43 Claims, 9 Drawing Sheets

PRE-EMPHASIS TECHNIQUE FOR ON-CHIP VOLTAGE-DRIVEN SINGLE-ENDED-TERMINATION DRIVERS

TECHNICAL FIELD

The present disclosure relates generally to wireline communication systems. More specifically, the present disclosure relates to systems and methods for a pre-emphasis technique for on-chip voltage-driven single-ended-termination drivers. This disclosure addresses the compensation of signal loss after it travels through a lossy medium that connects a transmitter side to a receiver side.

BACKGROUND

In an electronic device, a large amount of information may be sent from a transmitter to a receiver via a lossy medium. This information may be sent using a driver. The driver may boost the signal to ensure that the large amount of information is sent to the receiver.

Digital logic circuitry is being used in applications involving signals of ever-increasing frequencies. Wireless communications devices are one example of applications that require very high frequencies. Increases in the frequency may provide trade-offs in the form of signal loss and inability of a receiver to differentiate between digital high signals and digital low signals. As a result, a receiver may find it difficult to interpret sent information, increasing the bit error rate of a communication system.

One solution to this signal loss is the use of pre-emphasis in a driver. With pre-emphasis, a data transmission is boosted at certain times to reduce the bit error rate. Current mode logic (CML) drivers with pre-emphasis have been used. However, some applications may require the use of a non-current mode logic (non-CML) driver. As such, benefits may be realized by using pre-emphasis in a non-current mode logic (non-CML) driver.

SUMMARY

A pre-emphasis technique has been introduced for a voltage-driven single-ended-termination driver used in MIPI (Mobile Industry Processor Interface) drivers. A transmitter configured for pre-emphasis is described. The transmitter includes a voltage-driven single-ended-termination driver circuitry that includes a first termination point and a second termination point. The transmitter also includes a pre-emphasis encoder circuitry that receives a pre-emphasis signal.

The transmitter may reduce signal loss in transmission lines by detecting a transition in a data stream, adjusting a source determination resistance and obtaining a gain from the adjusted source determination resistance. The gain may include additional current supplied to the transmission lines to compensate for losses in the transmission line due to high frequencies. The pre-emphasis encoder circuitry may reduce a source determination resistance in the voltage-driven single-ended-termination driver circuitry when the pre-emphasis signal is a digital high. The pre-emphasis signal may be at a digital high for a bit time when a transition is detected in a data signal input to the voltage-driven single-ended-termination driver circuitry. The pre-emphasis signal may be an XOR combination of the data signal and a delayed version of the data signal.

The pre-emphasis encoder circuitry may include a first n-type metal-oxide-semiconductor (NMOS) transistor and a second NMOS transistor. The first NMOS transistor and the second NMOS transistor may be in series between the first termination point and ground. The pre-emphasis encoder circuitry may also include a first AND gate that receives a first input signal and the pre-emphasis signal. An output of the first AND gate may be connected to a gate of the first NMOS transistor.

The series combination of the first NMOS transistor and the second NMOS transistor may have a resistance of 50 ohms. The first AND gate may turn on the first NMOS transistor when the first input signal and the pre-emphasis signal are both a digital high. A source determination resistance for the first termination point may be reduced when the first NMOS transistor is turned on. A reduced source determination resistance may produce a gain in an output of the first termination point.

The pre-emphasis encoder circuitry may also include a third NMOS transistor and a fourth NMOS transistor. The third NMOS transistor and the fourth NMOS transistor may be in series between the second termination point and ground. The pre-emphasis encoder circuitry may further include a second AND gate that receives a second input signal and the pre-emphasis signal. A source determination resistance for the second termination point may be reduced when the third NMOS transistor is turned on. The series combination of the third NMOS transistor and the fourth NMOS transistor may have a resistance of 50 ohms.

The first input signal and the second input signal may be differential input signals that are a 180 degree phase shift from each other. The first termination point and the second termination point may output differential output signals that are a 180 degree phase shift from each other. The voltage-driven single-ended-termination driver circuitry may include a first n-type metal-oxide-semiconductor (NMOS) transistor, a second NMOS transistor, a third NMOS transistor, a fourth NMOS transistor and a fifth NMOS transistor. The third NMOS transistor and the fifth NMOS transistor may be in series between the first termination point and ground. The voltage-driven single-ended-termination driver circuitry may also include a sixth NMOS transistor. The fourth NMOS transistor and the sixth NMOS transistor may be in series between the second termination point and ground.

The series combination of the third NMOS transistor and the fifth NMOS transistor may have a resistance of 50 ohms and the series combination of the fourth NMOS transistor and the sixth NMOS transistor may have a resistance of 50 ohms. The voltage-driven single-ended-termination driver circuitry may also include a first AND gate that receives a first input signal and a digital high signal. A source of the first NMOS transistor may be connected to the first termination point. A drain of the first NMOS transistor may be connected to a source voltage. An output of the first AND gate may be connected to a gate of the first NMOS transistor and a gate of the fourth NMOS transistor. The voltage-driven single-ended-termination driver circuitry may further include a second AND gate that receives a second input signal and a digital high signal. A source of the second NMOS transistor may be connected to the second termination point. A drain of the second NMOS transistor may be connected to the source voltage. An output of the second AND gate may be connected to a gate of the second NMOS transistor and a gate of the third NMOS transistor.

A method for reducing signal loss in transmission lines is described. A transition in a data stream is detected. A source determination resistance is adjusted. A gain from the adjusted source determination resistance is obtained.

Adjusting a source determination resistance may include turning on a transistor. The source determination resistance may be a resistance between an output node and ground. Obtaining a gain from the adjusted source determination resistance may include supplying additional current to the output node for one bit time. Additional current may be supplied to the output node for a next bit time if a transition is detected in the data stream for the next bit time. The transistor may be turned off for a next bit time if a transition is not detected in the data stream for the next bit time. The method may be performed by a transmitter. A reduced source determination resistance may produce a gain in an output of the first termination point.

An electronic device configured for reducing signal loss in transmission lines is described. The electronic device includes means for detecting a transition in a data stream. The electronic device also includes means for adjusting a source determination resistance. The electronic device further includes means for obtaining a gain from the adjusted source determination resistance.

DETAILED DESCRIPTION

Figure 1:
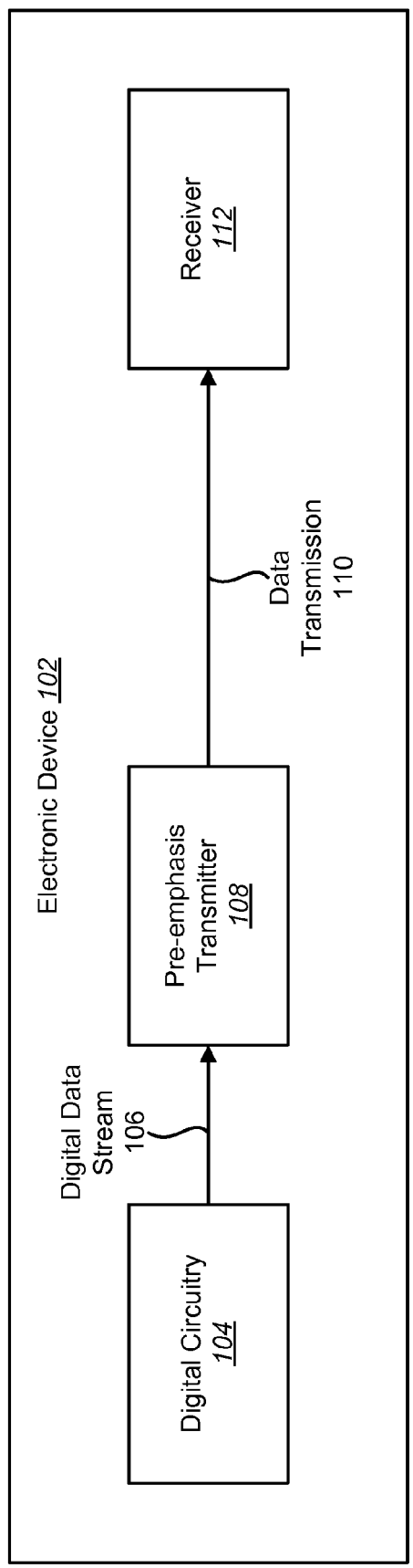
FIG. 1 illustrates an electronic device in which the teachings herein may be implemented.

FIG. 1 illustrates an electronic device 102 in which the teachings herein may be implemented. The electronic device 102 may be any electronic device 102 that uses high-frequency components. In one configuration, the electronic device 102 may be a wireline communication system, such as communication between a modem on a wireless device and a display (or a camera) on the wireless device. A wireless device may be a wireless communication device or a base station. Examples of electronic devices 102 include smartphones, laptops, gaming devices, etc.

The electronic device 102 may include digital circuitry 104. The digital circuitry 104 may generate a digital data stream 106 for transmission from a transmitter to a receiver 112. In one configuration, the digital data stream 106 may be transmitted from a transmitter to a receiver 112 over a lossy transmission line. The electronic device 102 may include a pre-emphasis transmitter 108. The pre-emphasis transmitter 108 may be used for high-speed signaling. The pre-emphasis transmitter 108 may receive the digital data stream 106 from the digital circuitry 104 and then transfer the data via a data transmission 110 to a receiver 112. The pre-emphasis transmitter 108 may emphasize high-frequency components while keeping low-frequency components in their original state in data transmissions 110 from the pre-emphasis transmitter 108 to the receiver 112. Pre-emphasis transmitters 108 are discussed in additional detail below in relation to FIG. 2.

Figure 2:
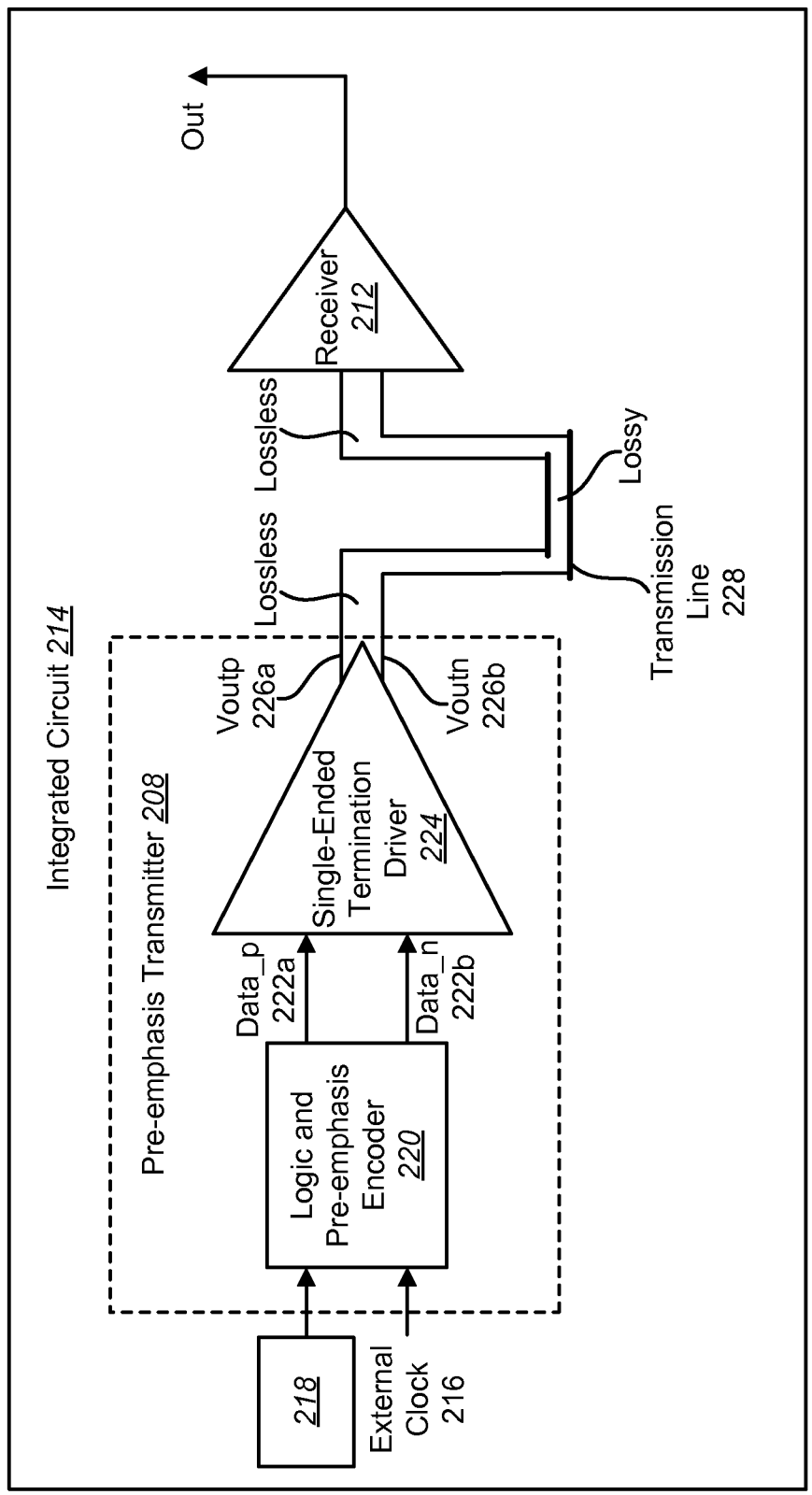
FIG. 2 illustrates an integrated circuit in which the teachings herein may be implemented.

FIG. 2 illustrates an integrated circuit 214 in which the teachings herein may be implemented. The integrated circuit 214 may be located on an electronic device 102. The integrated circuit 214 may include digital logic circuitry for use in a variety of applications. Within a wireless communication device, for example, digital circuitry is used to realize high speed frequency dividers. As an example, the receiver chain in a wireless communication device may include a local oscillator having a phase locked loop. A frequency divider in the feedback loop of the phase-locked loop may be a digital counter. For speed reasons, part of this counter may be realized in a type of logic referred to as current mode logic (CML).

A current mode logic (CML) driver may be used for high-speed signaling. A current mode logic (CML) driver may operate by steering current into an output node. Current mode logic (CML) is a differential logic family for transmitting data over a printed circuit board (PCB). In some instances, a current mode logic (CML) driver may be not be used. For example, the Mobile Industry Processor Interface (MIPI) standard specification requires a single-ended termination, a differential output voltage and a common-mode output voltage, which forces a voltage-driven single-ended-termination driver architecture. A voltage-driven single-ended-termination driver 224 may be used. The MIPI standard specification has also specified common-mode and differential-mode output voltages that force a 50 ohm ($\Omega$) termination for the pull-up and pull-down paths of an MIPI driver, thus forcing the architecture of a voltage-driven single-ended-termination driver 224. This is because a current mode logic (CML) driver is a point-to-point differential driver with a 100 ohm ($\Omega$) resistance between the differential outputs, since a 50 ohm ($\Omega$) termination for pull-up and pull-down paths cannot be achieved, due to the high impedance of the current source on either/both pull-up and pull-down paths.

A non-current mode logic (non-CML) driver may be a voltage-driven single-ended-termination driver 224. The voltage-driven single-ended-termination driver 224 may receive two differential input signals Data_p 222a and Data_n 222b that are a 180 degree phase shift from each other. Data_p 222a and Data_n 222b may be received from a logic and pre-emphasis encoder 220. The logic and pre-emphasis encoder 220 may receive an external clock 216 and digital data from a data source 218 (i.e., from digital circuitry 104). The data source 218 may be an internal pseudorandom binary sequence (PRBS) at 1.3 gigabits per second (Gbps). The external clock 216 may operate at 1.3 gigahertz (GHz). The use of a voltage-driven single-ended-termination driver 224 may be introduced on a MIPI test-chip and supported with silicon results. The jitter (in picoseconds (ps)) of the received signal with pre-emphasis is illustrated in Table 1 for the corner of the chip (tt=typical, ff=fast, ss=slow). The total jitter includes logic jitter and current mode logic (CML) driver jitter.

TABLE 1

| | | Jitter (ps) | | |
| --- | --- | --- | --- | --- |
| Split | Temperature (° C.) | Pre-emphasis | No pre-emphasis | Improvement (%) |
| tt | 25 | 202.72 | 228.01 | 11.1 |
| tt | 120 | 172.78 | 218.76 | 21 |

TABLE 1-continued

| Split | Temperature (° C.) | Jitter (ps) | | Improvement (%) |
| --- | --- | --- | --- | --- |
| | | Pre-emphasis | No pre-emphasis | |
| tt | −40 | 179.32 | 213.3 | 15.9 |
| ff | 25 | 128.18 | 145.78 | 12.1 |
| ff | 120 | 186.94 | 241.2 | 22.5 |
| ff | −40 | 126.87 | 137.4 | 7.7 |
| ss | 25 | 239.97 | 266.88 | 10.1 |
| ss | 120 | 269.65 | 311.4 | 13.4 |
| ss | −40 | 291.82 | 313.33 | 6.9 |

Splits at which the improvement (%) is lowest suffer from duty cycle distortion. Pre-emphasis may be unable to compensate for duty cycle distortion. The lowest improvement occurs at the ss with a temperature of −40° C., which suffers from duty cycle distortion. The total jitter includes logic jitter and receiver jitter and would show more accurate improvement if these two jitter sources (i.e., duty cycle distortion and receiver jitter) were removed.

The logic and pre-emphasis encoder 220 and the voltage-driven single-ended-termination driver 224 may be referred to as a pre-emphasis transmitter 208. The pre-emphasis transmitter 208 of FIG. 2 may be one configuration of the pre-emphasis transmitter 108 of FIG. 1. The pre-emphasis transmitter 208 is discussed in further detail below in relation to FIG. 3. The voltage-driven single-ended-termination driver 224 may output two differential signals Voutp 226a and Voutn 226b that are a 180 degree phase shift from each other.

The voltage-driven single-ended-termination driver 224 may pass the output signals (Voutp 226a and Voutn 226b) to a receiver 212 via a transmission line 228. The transmission line 228 may be a lossy wired connection between the voltage-driven single-ended-termination driver 224 and the receiver 212. In one configuration, the transmission line 228 may include 7.7 inches of lossy line and more than 15 inches of lossless line. The transmission line 228 may suffer from signal loss due to skin effects and dielectric loss.

Skin effect is the phenomenon by which currents tend to travel on the outer surface of a conductor at high frequencies. This phenomenon is caused by the tendency of a signal to reduce its total impedance, or inductance in the case of a high-frequency signal. As a result, the resistance of the conductor increases thereby limiting the bandwidth. When traveling through a transmission medium from a transmitter 208 to a receiver 212, the bandwidth on the transmission line 228 may be limited. Dielectric loss depends on the dielectric constant of a conductor. The dielectric loss is directly proportional to the frequency of a signal transmitted through a conductor.

Thus, a transmission line 228 may act as a low-pass filter that attenuates high-frequency components of the transmitted signal and limits the bandwidth. The rise and fall times of the signal become long and the data may be unable to settle to the correct value in case of a transition. As a result, the receiver 212 may find it difficult to interpret the sent information, thereby increasing the bit error rate of the communication system.

To compensate for the transmission line 228 acting as a low-pass filter, two solutions are popular: pre-emphasis at the transmitter side (i.e., using a pre-emphasis transmitter 208) and equalization at the receiver 212 side. Equalization at the receiver 212 side amplifies high-frequency components and/or attenuates low-frequency components of a received signal. This may compensate for losses in the transmission line 228, making it easier for the receiver 212 to correctly interpret received data.

Pre-emphasis at the transmitter side emphasizes high-frequency components while keeping low-frequency components in their original state. High-frequency components occur whenever there is a transition in data bits. In other words, whenever a digital logic signal changes from a digital logic low (logic_0) to a digital logic high (logic_1) or from a digital logic high (logic_1) to a digital logic low (logic_0), high-frequency components are introduced. Pre-emphasis techniques compare previous bits with current bits. If a transition is detected, the signal may be boosted.

Figure 3:
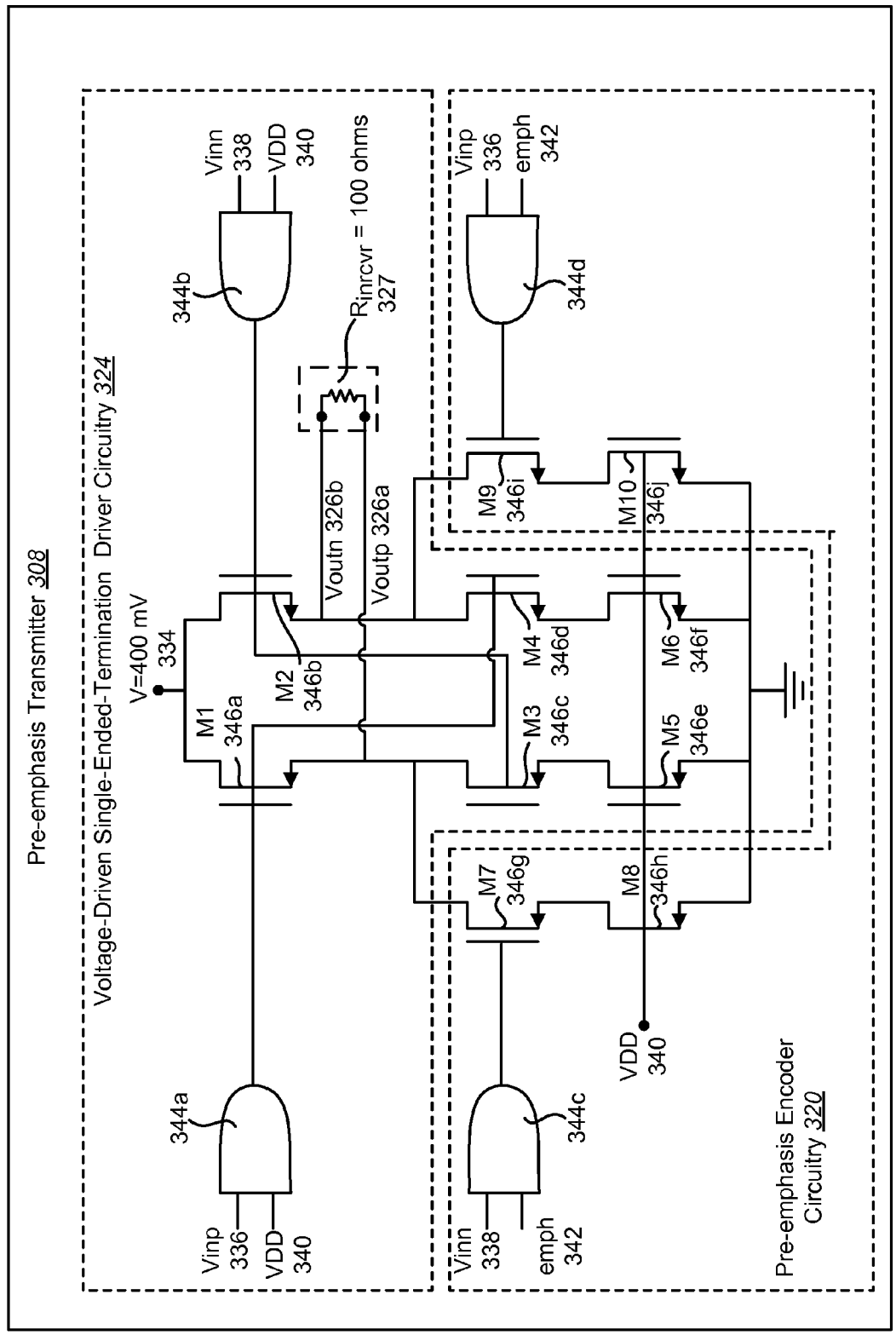
FIG. 3 illustrates a pre-emphasis transmitter for use in the present systems and methods.

FIG. 3 illustrates a pre-emphasis transmitter 308 for use in the present systems and methods. The pre-emphasis transmitter 308 of FIG. 3 may be one configuration of the pre-emphasis transmitter 108 of FIG. 1. The pre-emphasis transmitter 308 may include voltage-driven single-ended-termination driver circuitry 324 and pre-emphasis encoder circuitry 320.

The voltage-driven single-ended-termination driver circuitry 324 may include a supply voltage 334 where Vsupply=400 millivolts (mV). The non-current mode logic (non-CML) driver circuitry 324 may also include six transistors M1 346a, M2 346b, M3 346c, M4 346d, M5 346e and M6 346f. Each of the transistors 346 may be biased in the linear region so as to provide a single-ended 50 ohm (Ω) termination as required by the MIPI specification. The low supply voltage 334 requires that M1 346a and M2 346b be n-type metal-oxide-semiconductor (NMOS) transistors. M3 346c, M4 346d, M5 346e and M6 346f are also NMOS transistors.

M1 346a and M2 346b may each have a resistance of 50 ohms (Ω). The series combination of M3 346c and M5 346e may also have a resistance of 50 ohms (Ω). Likewise, the series combination of M4 346d and M6 346f may have a resistance of 50 ohms (Ω). Series combinations were required for M3 346c and M5 346e/M4 346d and M6 346f rather than a single NMOS transistor for electrostatic discharge (ESD) protection issues. ESD may not be an issue for M1 346a and M2 346b as the supply voltage 334 is provided through an on-chip regulator.

The voltage-driven single-ended-termination driver circuitry 324 may generate two differential data outputs Voutp 326a and Voutn 326b from two differential data inputs Vinp 336 and Vinn 338. Vinp 336 and Vinn 338 may be separated by a phase shift of 180 degrees and may represent Data_p 222a and Data_n 222b of FIG. 2 respectively. Voutp 326a and Voutn 326b may also be separated by a phase shift of 180 degrees.

A first AND gate 344a may receive Vinp 336 and VDD 340. VDD 340 is a digital logic high (logic_1) signal added for delay matching (i.e., to match the delays of AND gates in the pre-emphasis encoder circuitry 320). The output of the first AND gate 344a may be tied to the gate of M1 346a and the gate of M4 346d. A second AND gate 344b may receive Vinn 338 and VDD 340. The output of the second AND gate 344b may be tied to the gate of M2 346b and the gate of M3 346c. The gates of M5 346e and M6 346f are tied high (logic_1) for faster turn-on of the pull-down path (i.e., the path that includes M3 346c and M5 346e or M4 346d and M6 346f).

The drain of M1 346a and the drain of M2 346b may be connected to the supply voltage 334. The source of M1 346a may be connected to Voutp 326a and the drain of M3 346c. The source of M2 346b may be connected to Voutn 326b and the drain of M4 346d. The source of M3 346c may be connected to the drain of M5 346e. The gate of M5 346e may be connected to VDD 340 and the source of M5 346e may be connected to ground. The source of M4 346d may be connected to the drain of M6 346*f*. The gate of M6 346*f* may be connected to VDD 340 and the source of M6 346*f* may be connected to ground.

When Vinp 336 is a digital logic high (logic_1) and Vinn 338 is a digital logic low (logic_0), M1 346*a*, M4 346*d* and M6 346*f* are turned on and M2 346*b*, M3 346*c* and M5 346*e* are turned off. The current $I_p$ sent to the receiver 212 via Voutp 326*a* may be found using Equation (1):

$$I_p = \frac{400}{R_{M1} + R_{inrcvr} + R_{(M4+M6)}}. \quad (1)$$

In Equation (1), $R_{M1}$ is the resistance of M1 346*a* (typically 50 ohms (Ω)), $R_{inrcvr}$ is the resistance 327 of the receiver 212 (a high-speed receiver 212 has a differential input impedance of 100 ohms (Ω)) and $R_{(M4+M6)}$ is the resistance of the series combination of M4 346*d* and M6 346*f* (typically 50 ohms (Ω)). The current $I_p$ is the current through M1 346*a*, M4 346*d* and M6 346*f* in milliamps (mA). $I_p$ is typically 400/200=2 mA. Voutp−Voutn=+200 mV, indicating a digital logic high (logic_1). Similarly, when Vinn 338 is a digital logic high (logic_1) and Vinp 336 is a digital logic low (logic_0), the current $I_n$ sent to the receiver 212 via Voutn is 2 mA and Voutp-Voutn=−200 mV, denoting a digital logic low (logic_0).

As discussed above, the use of a voltage-driven single-ended-termination driver 224 may result in signal loss from a transmitter to a receiver 212. The use of pre-emphasis encoder circuitry 320 may boost the bandwidth and reduce the signal loss from a transmitter to a receiver 212. The pre-emphasis encoder circuitry 320 may include four transistors M7 346*g*, M8 346*h*, M9 346*i* and M10 346*j*. M7 346*g*, M8 346*h*, M9 346*i* and M10 346*j* may each be NMOS transistors.

Vinn 338 and a pre-emphasis signal (emph) 342 may be input into a third AND gate 344*c*. The output of the third AND gate 344*c* may be connected to the gate of M7 346*g*. The drain of M7 346*g* may be connected to Voutp 326*a* and the source of M7 346*g* may be connected to the drain of M8 346*h*. The gate of M8 346*h* may be connected to VDD 340 (for a faster pre-emphasis turn on) and the source of M8 346*g* may be connected to ground. Thus, when M7 346*g* is turned on (i.e., when the output of the third AND gate 344*c* is high (when Vinn 338 transitions to a digital high)), M7 346*g* and M8 346*h* are in series with each other and in parallel with M3 346*c* and M5 346*e*.

Vinp 336 and the pre-emphasis signal (emph) 342 may be input into a fourth AND gate 344*d*. The output of the fourth AND gate 344*d* may be connected to the gate of M9 346*i*. The drain of M9 346*i* may be connected to Voutn 326*b* and the source of M9 346*i* may be connected to the drain of M10 346*j*. The gate of M10 346*j* may be connected to VDD 340 (for a faster pre-emphasis turn-on) and the source of M10 346*j* may be connected to ground. Thus, when M9 346*i* is turned on (i.e., when the output of the fourth AND gate 344*d* is high (when Vinp 336 transitions to a digital high)), M9 346*i* and M10 346*j* are in series with each other and in parallel with M4 346*d* and M6 346*f*.

In the MIPI specification, the single-ended load capacitance is specified up to a maximum of 10 picoFarads (pF) and pre-emphasis is required to boost the bandwidth. When Vinp 336 transitions from a digital logic high (logic_1) to a digital logic low (logic_0) (and thus Vinn 338 transitions from a digital logic low (logic_0) to a digital logic high (logic_1)), the pre-emphasis encoder 220 forces the pre-emphasis signal (emph) 342 to a digital logic high (logic_1). Likewise, when Vinp 336 transitions from a digital logic low (logic_0) to a digital logic high (logic_1) (and thus Vinn 338 transitions from a digital logic high (logic_1) to a digital logic low (logic_0)), the pre-emphasis encoder 220 forces the pre-emphasis signal (emph) 342 to a digital logic high (logic_1). Obtaining the pre-emphasis signal (emph) 342 is discussed below in relation to FIG. 8.

When the pre-emphasis signal (emph) 342 is a digital logic high (logic_1), the third AND gate 344*c* outputs a digital logic high (logic_1) and M7 346*g* turns on. Thus, the series combination of M7 346*g* and M8 346*h* is now in parallel with the series combination of M3 346*c* and M5 346*e*. The single-ended resistance seen at node Voutp 326*a* may be represented as $R_{Voutp}$, and is reduced according to Equation (2):

$$R_{Voutp} = \frac{R_{(M3+M5)}R_{(M7+M8)}}{R_{(M3+M5)} + R_{(M7+M8)}}. \quad (2)$$

The series resistance of M7 346*g* and M8 346*h* is represented as $R_{(M7+M8)}$ and the series resistance of M3 346*c* and M5 346*e* is represented as $R_{(M3+M5)}$. If $R_{(M7+M8)}$=50 ohms (Ω) and $R_{(M3+M5)}$=50 ohms (Ω), then the single-ended resistance seen at node Voutp 326*a* is $R_{Voutp}$=25 ohms (Ω). Using Equation (1) above, the current $I_p$ through node Voutp 326*a* goes from 2 mA to 2.29 mA, thus increasing the signal magnitude at the indicated data transition. This in turn reduces the rise time or fall time of the output signal.

Similarly, when the pre-emphasis signal (emph) 342 is a digital logic high (logic_0), the fourth AND gate 344*d* outputs a digital logic high (logic_1) and M9 346*i* turns on. Thus, the series combination of M9 346*i* and M10 346*j* is now in parallel with the series combination of M4 346*d* and M6 346*f*. The single-ended resistance seen at node Voutn 326*b* may be represented as $R_{Voutn}$ and is reduced according to Equation (3):

$$R_{Voutn} = \frac{R_{(M4+M6)}R_{(M9+M10)}}{R_{(M4+M6)} + R_{(M9+M10)}}. \quad (3)$$

The series resistance of M9 346*i* and M10 346*j* is represented as $R_{(M9+M10)}$ and the series resistance of M4 346*d* and M6 346*f* is represented as $R_{(M4+M6)}$. If $R_{(M9+M10)}$=50 ohms (Ω) and $R_{(M4+M6)}$=50 ohms (Ω), then the single-ended resistance seen at node Voutn 326*b* is $R_{Voutn}$=25 ohms (Ω). The current $I_n$ through node Voutn 326*b* goes from 2 mA to 2.29 mA, thus increasing the signal magnitude at the indicated data transition. This in turn reduces the rise time or fall time of the output signal. The pre-emphasis signal (emph) 342 may stay high for one bit time after a data transition.

Figure 4:
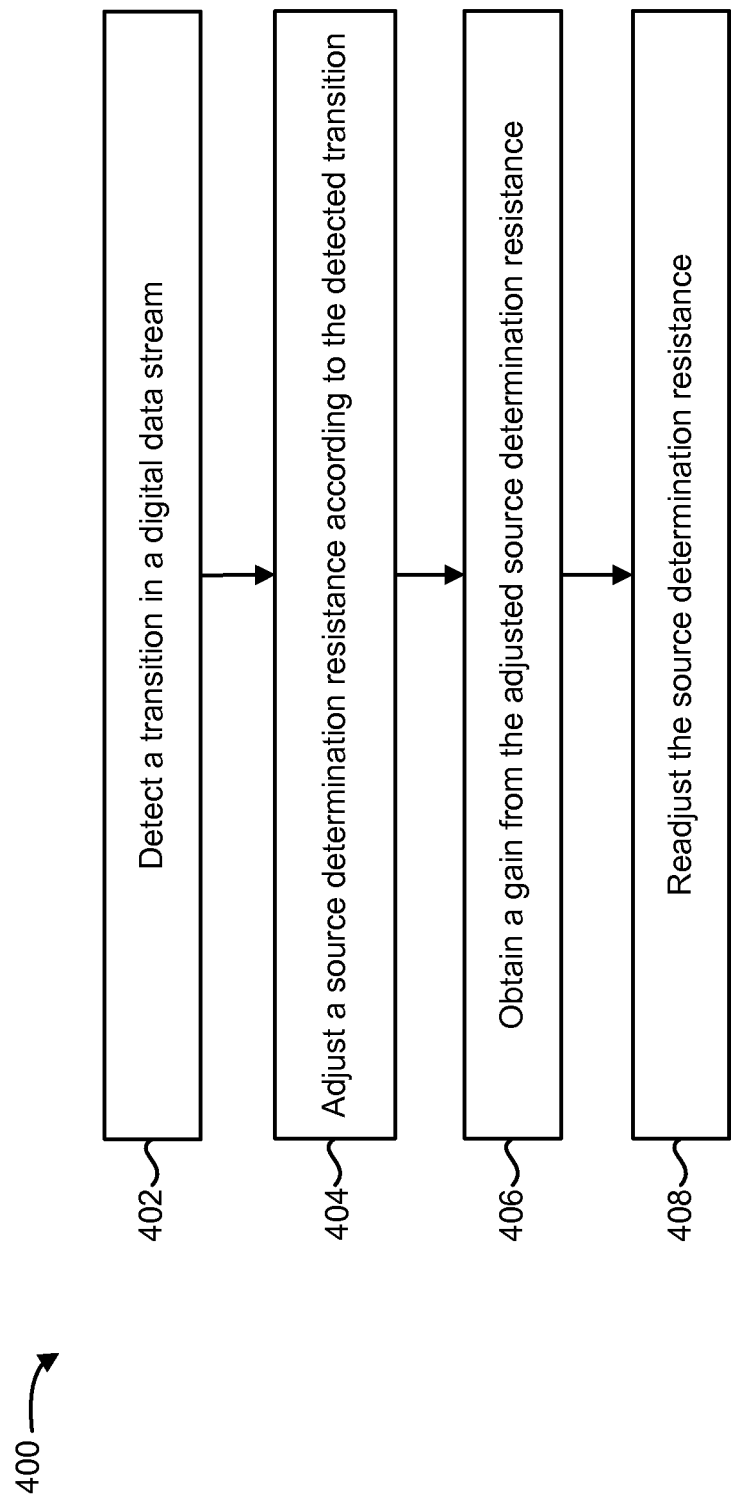
FIG. 4 is a flow diagram of a method for using pre-emphasis techniques in a non-current mode logic (non-CML) driver.

FIG. 4 is a flow diagram of a method 400 for using pre-emphasis techniques in a voltage-driven single-ended-termination driver 224. The method 400 may be performed by a pre-emphasis transmitter 308. The pre-emphasis transmitter 308 may detect 402 a transition in a digital data stream 106. The transition may occur in both Data_p 222*a* and Data_n 222*b*. The pre-emphasis transmitter 308 may then adjust 404 a source determination resistance according to the detected transition. The pre-emphasis transmitter 308 may obtain 406 a gain from the adjusted source determination resistance. The obtained gain may be an increase in the current output by the pre-emphasis transmitter 308. The pre-emphasis transmitter 308 may then readjust 408 the source determination resistance after a bit time.

Figure 5:
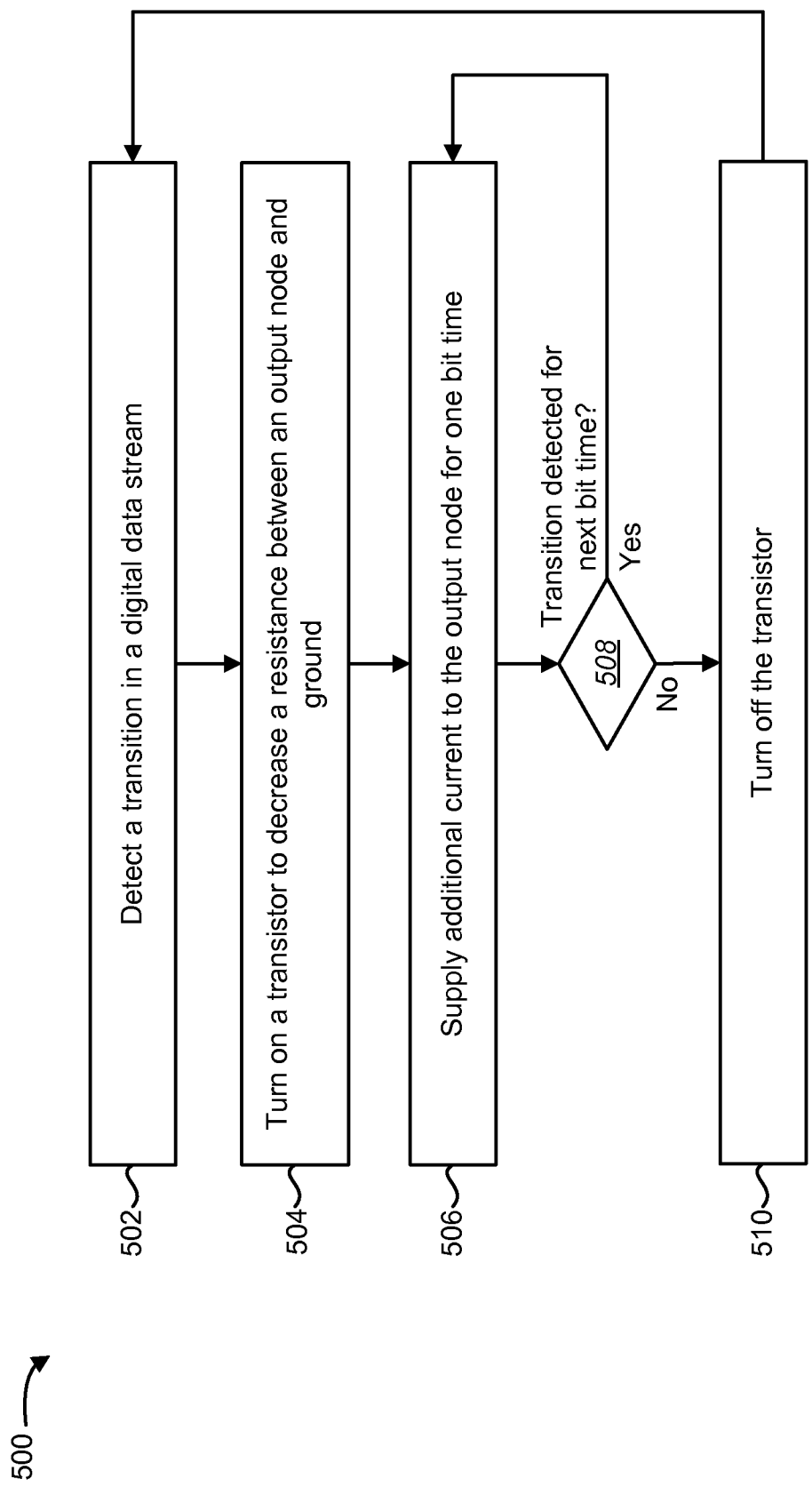
FIG. 5 is a flow diagram of another method for using pre-emphasis techniques in a non-current mode logic (non-CML) driver.

FIG. 5 is a flow diagram of another method 500 for using pre-emphasis techniques in a voltage-driven single-ended-termination driver 224. The method 500 may be performed by a pre-emphasis transmitter 308. The pre-emphasis transmitter 308 may detect 502 a transition in a digital data stream 106. The transition may be either a transition from a digital logic low (logic_0) to a digital logic high (logic_1) or a transition from a digital logic high (logic_1) to a digital logic low (logic_0).

The pre-emphasis transmitter 308 may turn on 504 a transistor to decrease a resistance between an output node 326 and ground. In one configuration, the transistor may be M7 346g and the output node 326 may be the node Voutp 326a. In another configuration, the transistor may be M9 346i and the output node 326 may be the node Voutn 326b. By turning on M7 346g, the series combination of M7 346g and M8 346h is placed in parallel with the series combination of M3 346c and M5 346e, thereby reducing the single-ended resistance seen at node Voutp 326a and supplying 506 additional current to the output node Voutp 326a for one bit time. Likewise, by turning on M9 346i, the series combination of M9 346i and M10 346j is placed in parallel with the series combination of M4 346d and M6 346f, thereby reducing the single-ended resistance seen at node Voutn 326b and supplying 506 additional current to the output node Voutn 326b for one bit time.

The pre-emphasis transmitter 308 may determine 508 whether a transition is detected for the next bit time. If a transition is detected for the next bit time, the pre-emphasis transmitter 308 may supply 506 additional current to the output node 326 for one bit time (i.e., keep the transistor turned on). If a transition is not detected for the next bit time, the pre-emphasis transmitter 308 may turn off 510 the transistor. The pre-emphasis transmitter 308 may then detect 502 another transition in the digital data stream 106.

Figure 6:
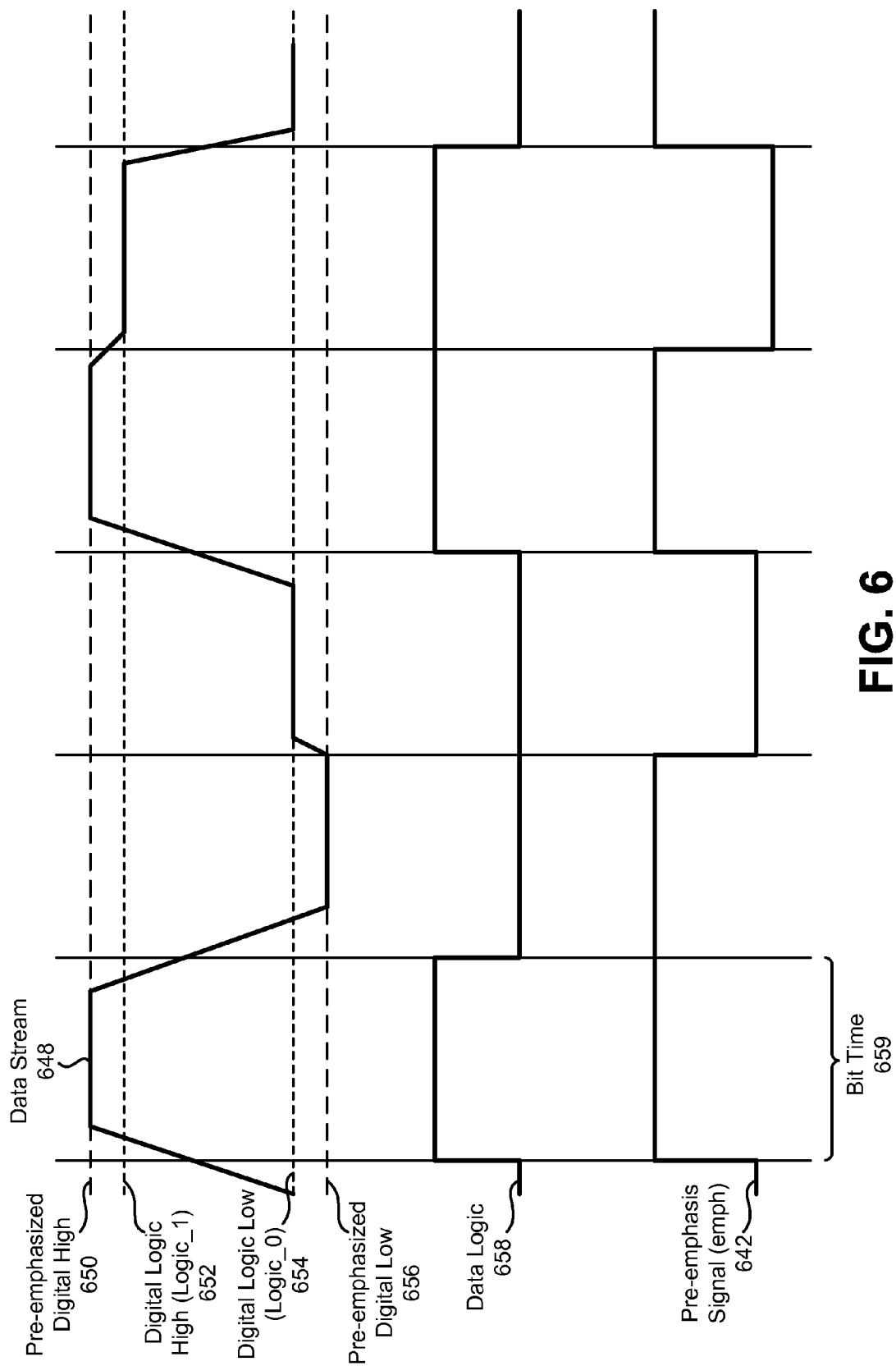
FIG. 6 is a timing diagram illustrating a data stream, data logic and a pre-emphasis signal (emph)

FIG. 6 is a timing diagram illustrating a data stream 648, data logic 658 and a pre-emphasis signal (emph) 642. The data stream 648 may be the output of the pre-emphasis transmitter 308. For example, the data stream 648 may be the output at node Voutp 326a or node Voutn 326b. The data stream 648 may cycle between a digital logic high (logic_1) 652 and a digital logic low (logic_0) 654. The data stream 648 may change at the beginning of each bit time 659.

The digital logic of the data stream 648 may be shown in the data logic 658. When the data stream 648 is at a digital logic high (logic_1) 652, the data logic 658 is high. When the data stream 648 is at a digital logic low (logic_0) 654, the data logic 658 is low. The pre-emphasis signal (emph) 642 is also shown. The pre-emphasis signal (emph) 642 may go from low to high whenever the data stream 648 (and thus the data logic 658) goes through a transition. For example, if the data stream 648 goes from a digital logic high (logic_1) 652 to a digital logic low (logic_0) 654 then the pre-emphasis signal (emph) 642 will go to high for that bit time 659. If the data stream 648 goes from a digital logic low (logic_0) 654 to a digital logic high (logic_1) 652 then the pre-emphasis signal (emph) 642 will also go to high for that bit time 659.

When the pre-emphasis signal (emph) 642 is high for a bit time 659, the data stream 648 receives a boost (in the form of increased current) for that bit time 659. Thus, in the bit times 659 where the pre-emphasis signal (emph) 642 is high, the data stream 648 is boosted from a digital logic high (logic_1) 652 to a pre-emphasized digital high 650 or from a digital logic low (logic_0) 654 to a pre-emphasized digital low 656.

Figure 7:
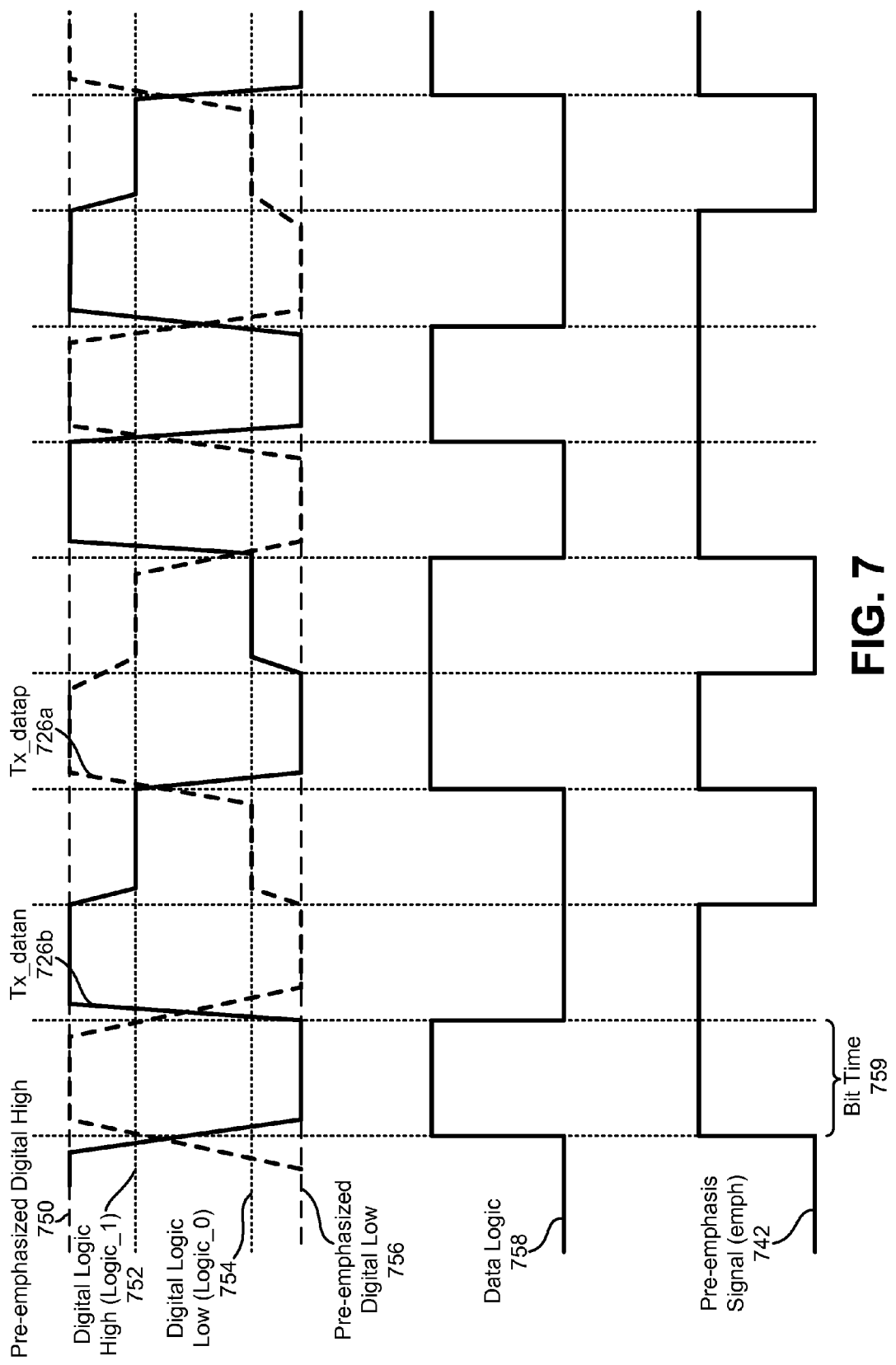
FIG. 7 is a timing diagram illustrating differential transmission data streams, a pre-emphasis signal (emph) and data logic.

FIG. 7 is a timing diagram illustrating differential transmission data streams 726, a pre-emphasis signal (emph) 742 and data logic 758. The differential transmission data streams 726 Tx_datap 726a and Tx_datan 726b represent the transmitted signals from the pre-emphasis transmitter 308 and may be separated by a 180 degree phase shift. Thus, when Tx_datan 726b goes to a digital logic high (logic_1) 752, Tx_datap 726a goes to a digital logic low (logic_0) 754. The data logic 758 refers to the digital logic of the Tx_datap 726a data stream. When Tx_datap 726a goes to a digital logic high (logic_1) 752, the data logic 758 goes high and when Tx_datap 726a goes to a digital logic low (logic_0) 754, the data logic 758 goes low.

The pre-emphasis signal (emph) 742 is also shown. The pre-emphasis signal (emph) 742 may go from low to high when Tx_datap 726a transitions from a digital logic high (logic_1) 752 to a digital logic low (logic_0) 754 (and Tx_datan 726b transitions from a digital logic low (logic_0) 754 to a digital logic high (logic_1) 752)) or when Tx_datap 726a transitions from a digital logic low (logic_0) 754 to a digital logic high (logic_1) 752 (and Tx_datan 726b transitions from a digital logic high (logic_1) 752 to a digital logic low (logic_0) 754). Whenever Tx_datap 726a transitions, Tx_datan 726b also transitions. When the pre-emphasis signal (emph) 742 is high, both Tx_datap 726a and Tx_datan 726b receive a boost. For example, when the pre-emphasis signal (emph) 742 is high in the first bit time 759, Tx_datan 726a is boosted to a pre-emphasized digital low 756 and Tx_datap 726a is boosted to a pre-emphasized digital high 750.

Figure 8:
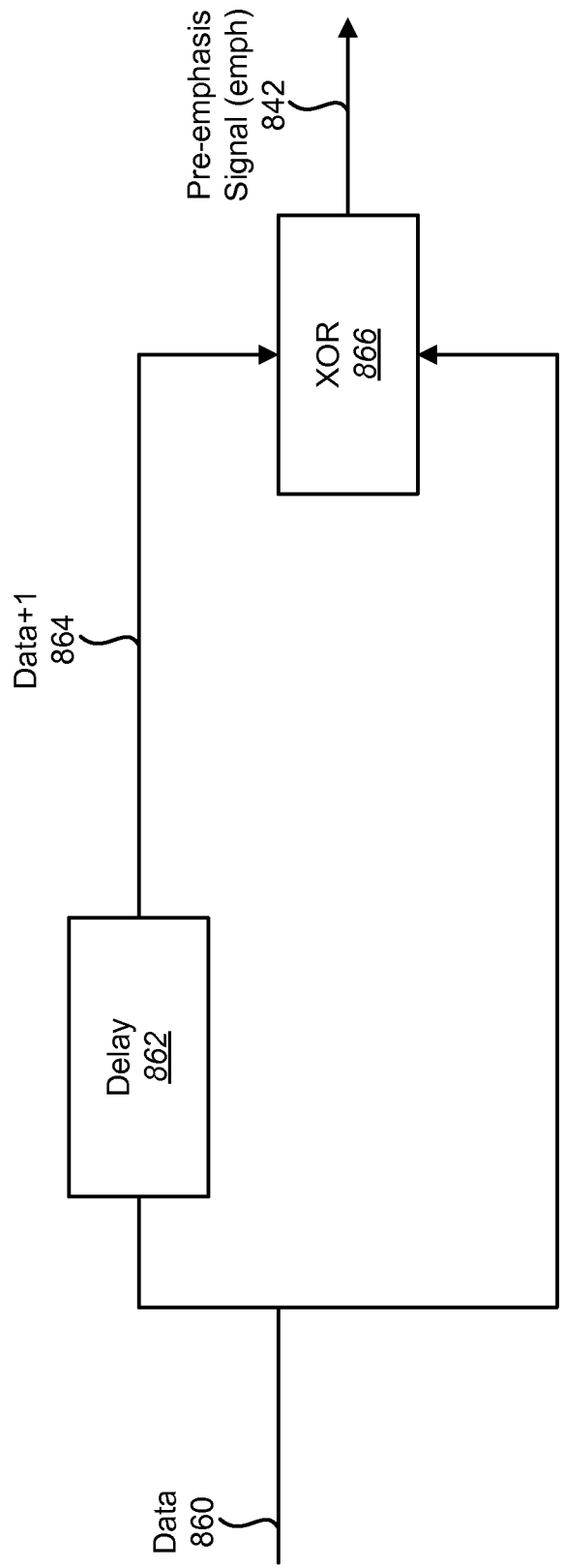
FIG. 8 is a block diagram illustrating the generation of a pre-emphasis signal (emph)

FIG. 8 is a block diagram illustrating the generation of a pre-emphasis signal (emph) 842. A data signal 860 may be delayed 862 for a bit time 759 to obtain a delayed data signal Data+1 864. An XOR block 866 may receive the data signal 860 and the delayed data signal Data+1 864. The XOR block 866 may then output the pre-emphasis signal (emph) 842. The pre-emphasis signal (emph) 842 is thus high whenever the data signal 860 and the delayed data signal Data+1 864 are not equal (representing a transition) and low whenever the data signal 860 and the delayed data signal Data+1 864 are equal (representing no transition). A long string of 1s or 0s does not require pre-emphasis because bits have enough time to settle to the correct value and the receiver 212 has higher gain at lower frequencies. The pre-emphasis signal (emph) 842 is illustrated below in Table 2.

TABLE 2

| Data | Data + 1 | emph |
|------|----------|------|
| 1    | 1        | 0    |
| 0    | 1        | 1    |
| 1    | 0        | 1    |
| 0    | 0        | 0    |

Figure 9:
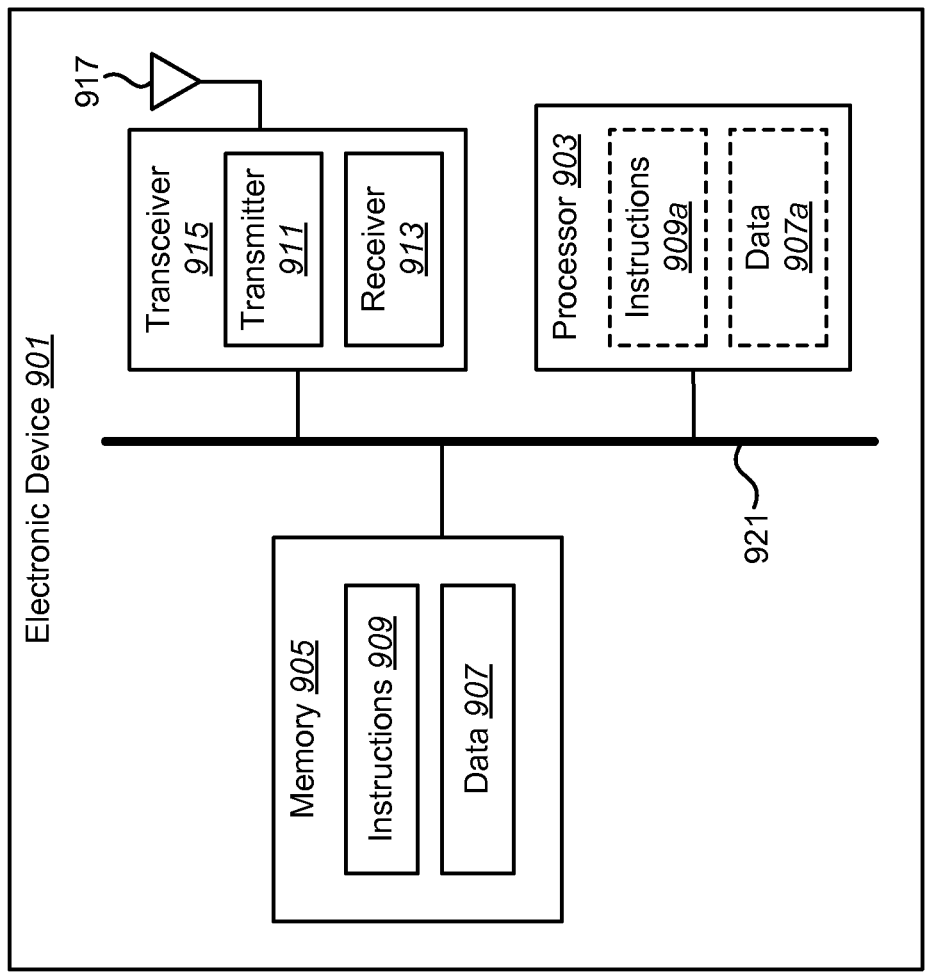
FIG. 9 illustrates certain components that may be included within an electronic device.

FIG. 9 illustrates certain components that may be included within an electronic device 901. The electronic device 901 may be an access terminal, a mobile station, a user equipment (UE), an access station, a base station, etc. The electronic device 901 includes a processor 903. The processor 903 may be a general purpose single-or multi-chip microprocessor (e.g., an ARM), a special purpose microprocessor (e.g., a digital signal processor (DSP)), a microcontroller, a programmable gate array, etc. The processor 903 may be referred to as a central processing unit (CPU). Although just a single processor 903 is shown in the electronic device 901 of FIG. 9, in an alternative configuration, a combination of processors (e.g., an ARM and DSP) could be used.

The electronic device 901 also includes memory 905. The memory 905 may be any electronic component capable of storing electronic information. The memory 905 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 907 and instructions 909 may be stored in the memory 905. The instructions 909 may be executable by the processor 903 to implement the methods disclosed herein. Executing the instructions 909 may involve the use of the data 907 that is stored in the memory 905. When the processor 903 executes the instructions 909, various portions of the instructions 909a may be loaded onto the processor 903, and various pieces of data 907a may be loaded onto the processor 903.

The electronic device 901 may also include a transmitter 911 and a receiver 913 to allow transmission and reception of signals to and from the electronic device 901. The transmitter 911 and receiver 913 may be collectively referred to as a transceiver 915. An antenna 917 may be electrically coupled to the transceiver 915. The electronic device 901 may also include (not shown) multiple transmitters, multiple receivers, multiple transceivers and/or additional antennas.

The various components of the electronic device 901 may be coupled together by one or more buses, which may include a power bus, a control signal bus, a status signal bus, a data bus, etc. For the sake of clarity, the various buses are illustrated in FIG. 9 as a bus system 921.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement (s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 4 and 5, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A transmitter configured for pre-emphasis, comprising:
a non-current mode logic voltage-driven single-ended-termination driver circuitry, wherein the non-current mode logic voltage-driven single-ended-termination driver circuitry comprises a first termination point and a second termination point; and
a pre-emphasis encoder circuitry, wherein the pre-emphasis encoder circuitry receives a pre-emphasis signal, and wherein the pre-emphasis encoder circuitry comprises:
a first n-type metal-oxide-semiconductor (NMOS) transistor; and
a second NMOS transistor, wherein the first NMOS transistor and the second NMOS transistor are in series between the first termination point and ground.

2. The transmitter of claim 1, wherein the transmitter reduces signal loss in transmission lines by:
detecting a transition in a data stream;
adjusting a source determination resistance; and
obtaining a gain from the adjusted source determination resistance.

3. The transmitter of claim 2, wherein the gain comprises additional current supplied to the transmission lines to compensate for losses in the transmission line due to high frequencies.

4. The transmitter of claim 1, wherein the pre-emphasis encoder circuitry reduces a source determination resistance in the non-current mode logic voltage-driven single-ended-termination driver circuitry when the pre-emphasis signal is a digital high.

5. The transmitter of claim 1, wherein the pre-emphasis signal is at a digital high for a bit time when a transition is detected in a data signal input to the non-current mode logic voltage-driven single-ended-termination driver circuitry.

6. The transmitter of claim 5, wherein the pre-emphasis signal is an XOR combination of the data signal and a delayed version of the data signal.

7. The transmitter of claim 1, wherein the pre-emphasis encoder circuitry further comprises:
a first AND gate, wherein the first AND gate receives a first input signal and the pre-emphasis signal, and wherein an output of the first AND gate is connected to a gate of the first NMOS transistor.

8. The transmitter of claim 7, wherein the series combination of the first NMOS transistor and the second NMOS transistor has a resistance of 50 ohms.

9. The transmitter of claim 7, wherein the first AND gate turns on the first NMOS transistor when the first input signal and the pre-emphasis signal are both a digital high, and wherein a source determination resistance for the first termination point is reduced when the first NMOS transistor is turned on.

10. The transmitter of claim 9, wherein a reduced source determination resistance produces a gain in an output of the first termination point.

11. The transmitter of claim 7, wherein the pre-emphasis encoder circuitry further comprises:
a third NMOS transistor;
a fourth NMOS transistor, wherein the third NMOS transistor and the fourth NMOS transistor are in series between the second termination point and ground; and
a second AND gate, wherein the second AND gate receives a second input signal and the pre-emphasis signal, and wherein a source determination resistance for the second termination point is reduced when the third NMOS transistor is turned on.

12. The transmitter of claim 11, wherein the series combination of the third NMOS transistor and the fourth NMOS transistor has a resistance of 50 ohms.

13. The transmitter of claim 11, wherein the first input signal and the second input signal are differential input signals that are a 180 degree phase shift from each other.

14. The transmitter of claim 1, wherein the first termination point and the second termination point output differential output signals that are a 180 degree phase shift from each other.

15. The transmitter of claim 1, wherein the non-current mode logic voltage-driven single-ended-termination driver circuitry comprises:
a first n-type metal-oxide-semiconductor (NMOS) transistor;
a second NMOS transistor;
a third NMOS transistor;
a fourth NMOS transistor;
a fifth NMOS transistor, wherein the third NMOS transistor and the fifth NMOS transistor are in series between the first termination point and ground; and
a sixth NMOS transistor, wherein the fourth NMOS transistor and the sixth NMOS transistor are in series between the second termination point and ground.

16. The transmitter of claim 15, wherein the series combination of the third NMOS transistor and the fifth NMOS transistor has a resistance of 50 ohms, and wherein the series combination of the fourth NMOS transistor and the sixth NMOS transistor has a resistance of 50 ohms.

17. The transmitter of claim 15, wherein the non-current mode logic voltage-driven single-ended-termination driver circuitry further comprises:
a first AND gate, wherein the first AND gate receives a first input signal and a digital high signal, wherein a source of the first NMOS transistor is connected to the first termination point, wherein a drain of the first NMOS transistor is connected to a source voltage, and wherein an output of the first AND gate is connected to a gate of the first NMOS transistor and a gate of the fourth NMOS transistor; and
a second AND gate, wherein the second AND gate receives a second input signal and a digital high signal, wherein a source of the second NMOS transistor is connected to the second termination point, wherein a drain of the second NMOS transistor is connected to the source voltage, and wherein an output of the second AND gate is connected to a gate of the second NMOS transistor and a gate of the third NMOS transistor.

18. The transmitter of claim 1, wherein the transmitter is for use in a Mobile Industry Processor Interface standard.

19. The transmitter of claim 1, wherein the non-current mode logic voltage-driven single-ended-termination driver circuitry has a 50 ohm termination for pull-up and pull-down paths.

20. A method for reducing signal loss in transmission lines by a transmitter, comprising:
detecting a transition in a data stream;
adjusting a source determination resistance; and
obtaining a gain from the adjusted source determination resistance, wherein the transmitter comprises:
a non-current mode logic voltage-driven single-ended-termination driver circuitry, wherein the non-current mode logic voltage-driven single-ended-termination driver circuitry comprises a first termination point and a second termination point; and a pre-emphasis encoder circuitry, wherein the pre-emphasis encoder circuitry receives a pre-emphasis signal, and wherein the pre-emphasis encoder circuitry comprises:
a first n-type metal-oxide-semiconductor (NMOS) transistor; and
a second NMOS transistor, wherein the first NMOS transistor and the second NMOS transistor are in series between the first termination point and ground.

21. The method of claim 20, wherein adjusting a source determination resistance comprises turning on a transistor, and wherein the source determination resistance is a resistance between an output node and ground.

22. The method of claim 21, wherein obtaining a gain from the adjusted source determination resistance comprises supplying additional current to the output node for one bit time.

23. The method of claim 22, further comprising supplying additional current to the output node for a next bit time if a transition is detected in the data stream for the next bit time.

24. The method of claim 22, further comprising turning off the transistor for a next bit time if a transition is not detected in the data stream for the next bit time.

25. The method of claim 20, wherein the pre-emphasis encoder circuitry reduces a source determination resistance in the non-current mode logic voltage-driven single-ended-termination driver circuitry when the pre-emphasis signal is a digital high.

26. The method of claim 20, wherein the pre-emphasis signal is at a digital high for a bit time when a transition is detected in a data signal input to the non-current mode logic voltage-driven single-ended-termination driver circuitry.

27. The method of claim 26, wherein the pre-emphasis signal is an XOR combination of a data signal and a delayed version of the data signal.

28. The method of claim 27, wherein the pre-emphasis encoder circuitry further comprises:
a first AND gate, wherein the first AND gate receives a first input signal and the pre-emphasis signal, and wherein an output of the first AND gate is connected to a gate of the first NMOS transistor.

29. The method of claim 28, wherein the series combination of the first NMOS transistor and the second NMOS transistor has a resistance of 50 ohms.

30. The method of claim 28, wherein the first AND gate turns on the first NMOS transistor when the first input signal and the pre-emphasis signal are both a digital high, and wherein a source determination resistance for the first termination point is reduced when the first NMOS transistor is turned on.

31. The method of claim 30, wherein a reduced source determination resistance produces a gain in an output of the first termination point.

32. The method of claim 30, wherein the pre-emphasis encoder circuitry further comprises:
a third NMOS transistor;
a fourth NMOS transistor, wherein the third NMOS transistor and the fourth NMOS transistor are in series between the second termination point and ground; and
a second AND gate, wherein the second AND gate receives a second input signal and the pre-emphasis signal, and wherein a source determination resistance for the second termination point is reduced when the third NMOS transistor is turned on.

33. The method of claim 32, wherein the series combination of the third NMOS transistor and the fourth NMOS transistor has a resistance of 50 ohms.

34. The method of claim 32, wherein the first input signal and the second input signal are differential input signals that are a 180 degree phase shift from each other.

35. The method of claim 20, wherein the first termination point and the second termination point output differential output signals that are a 180 degree phase shift from each other.

36. The method of claim 20, wherein the non-current mode logic voltage-driven single-ended-termination driver circuitry comprises:
a first n-type metal-oxide-semiconductor (NMOS) transistor;
a second NMOS transistor;
a third NMOS transistor;
a fourth NMOS transistor;
a fifth NMOS transistor, wherein the third NMOS transistor and the fifth NMOS transistor are in series between the first termination point and ground; and
a sixth NMOS transistor, wherein the fourth NMOS transistor and the sixth NMOS transistor are in series between the second termination point and ground.

37. The method of claim 36, wherein the series combination of the third NMOS transistor and the fifth NMOS transistor has a resistance of 50 ohms, and wherein the series combination of the fourth NMOS transistor and the sixth NMOS transistor has a resistance of 50 ohms.

38. The method of claim 36, wherein the non-current mode logic voltage-driven single-ended-termination driver circuitry further comprises:
a first AND gate, wherein the first AND gate receives a first input signal and a digital high signal, wherein a source of the first NMOS transistor is connected to the first termination point, wherein a drain of the first NMOS transistor is connected to a source voltage, and wherein an output of the first AND gate is connected to a gate of the first NMOS transistor and a gate of the fourth NMOS transistor; and
a second AND gate, wherein the second AND gate receives a second input signal and a digital high signal, wherein a source of the second NMOS transistor is connected to the second termination point, wherein a drain of the second NMOS transistor is connected to the source voltage, and wherein an output of the second AND gate is connected to a gate of the second NMOS transistor and a gate of third NMOS transistor.

39. An electronic device configured for reducing signal loss in transmission lines, comprising:
means for detecting a transition in a data stream;
means for adjusting a source determination resistance; and
means for obtaining a gain from the adjusted source determination resistance, wherein the electronic device comprises a transmitter, wherein the transmitter comprises:
a non-current mode logic voltage-driven single-ended-termination driver circuitry, wherein the non-current mode logic voltage-driven single-ended-termination driver circuitry comprises a first termination point and a second termination point; and
a pre-emphasis encoder circuitry, wherein the pre-emphasis encoder circuitry receives a pre-emphasis signal, and wherein the pre-emphasis encoder circuitry comprises:
a first n-type metal-oxide-semiconductor (NMOS) transistor; and a second NMOS transistor, wherein the first NMOS transistor and the second NMOS transistor are in series between the first termination point and ground.

40. The electronic device of claim 39, wherein the means for adjusting a source determination resistance comprises means for turning on a transistor, and wherein the source determination resistance is a resistance between an output node and ground.

41. The electronic device of claim 40, wherein the means for obtaining a gain from the adjusted source determination resistance comprises means for supplying additional current to the output node for one bit time.

42. The electronic device of claim 41, further comprising means for supplying additional current to the output node for a next bit time if a transition is detected in the data stream for the next bit time.

43. The electronic device of claim 41, further comprising means for turning off the transistor for a next bit time if a transition is not detected in the data stream for the next bit time.

* * * * *